(12) United States Patent
Weil et al.

(10) Patent No.: US 12,451,873 B2
(45) Date of Patent: Oct. 21, 2025

(54) QUADRATURE DUTY CYCLE CORRECTION CIRCUIT

(71) Applicant: QUALCOMM Incorporated, San Diego, CA (US)

(72) Inventors: Andrew Weil, San Diego, CA (US); Jaswinder Singh, San Diego, CA (US); Sameer Wadhwa, San Diego, CA (US); Dongwon Seo, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 56 days.

(21) Appl. No.: 18/312,317

(22) Filed: May 4, 2023

(65) Prior Publication Data
US 2024/0372535 A1 Nov. 7, 2024

(51) Int. Cl.
*H03K 3/017* (2006.01)
*H03K 5/156* (2006.01)

(52) U.S. Cl.
CPC ........... *H03K 3/017* (2013.01); *H03K 5/1565* (2013.01)

(58) Field of Classification Search
None
See application file for complete search history.

(56) References Cited

U.S. PATENT DOCUMENTS

| | | |
|---|---|---|
| 6,958,639 B2 | 10/2005 | Park et al. |
| 7,298,193 B2 | 11/2007 | Agarwal et al. |
| 7,683,683 B1 | 3/2010 | Majumder et al. |
| 7,863,957 B2 | 1/2011 | Jang et al. |
| 7,940,103 B2 | 5/2011 | Satoh et al. |
| 7,994,834 B2 | 8/2011 | Ku |
| 8,624,647 B2 | 1/2014 | Chong et al. |
| 9,438,208 B2 | 9/2016 | Sridhar et al. |
| 2008/0164920 A1 | 7/2008 | Cho et al. |
| 2009/0085629 A1 | 4/2009 | Harris et al. |
| 2009/0278580 A1 | 11/2009 | Kim |

(Continued)

FOREIGN PATENT DOCUMENTS

| | | |
|---|---|---|
| CN | 101296007 A | 10/2008 |
| JP | 2007184925 A | 7/2007 |
| JP | 2011250107 A | 12/2011 |

OTHER PUBLICATIONS

International Search Report and Written Opinion—PCT/US2024/024670—ISA/EPO—Jul. 3, 2024.

*Primary Examiner* — Cassandra F Cox
(74) *Attorney, Agent, or Firm* — Loza & Loza, LLP

(57) ABSTRACT

A duty cycle correction circuit includes four pairs of serially coupled transistors. A first two of the serial pairs of transistors couple between an internal node for complement output clock signal and ground. A second two of the serial pairs of transistors couple between the internal node and a power supply node for a power supply voltage. Each serial pair is controlled by a corresponding pair of quadrature clock signals in which one of the quadrature clock signal is delayed with respect to the other quadrature clock signal be one quarter of a clock period. The first two serial pairs of transistors thus combine to discharge the internal node for one-half clock period whereas the second two serial pairs of transistors combine to charge the internal node for one-half clock period so that the complement output clock signal has a 50% duty cycle.

18 Claims, 4 Drawing Sheets

(56) References Cited

U.S. PATENT DOCUMENTS

| | | |
|---|---|---|
| 2012/0212271 A1 | 8/2012 | Dally et al. |
| 2013/0249612 A1 | 9/2013 | Zerbe et al. |
| 2014/0003550 A1 | 1/2014 | Krishnamoorthy et al. |
| 2014/0152358 A1 | 6/2014 | Seo |
| 2019/0181847 A1 | 6/2019 | Satoh et al. |
| 2020/0195240 A1 | 6/2020 | Lim et al. |
| 2021/0367588 A1* | 11/2021 | Lim .................. H03K 5/1565 |

\* cited by examiner

QUADRATURE DUTY CYCLE CORRECTION CIRCUIT

TECHNICAL FIELD

This application relates to duty cycle correction, and more particularly to a duty cycle correction circuit configured to process quadrature clock signals to provide a clock signal having a corrected duty cycle.

BACKGROUND

High-frequency clock signals often suffer from duty cycle distortion. For example, a 50% duty cycle may be desired for a clock signal but duty cycle distortion produces a duty cycle that is either less than or greater than the desired duty cycle. It is thus conventional to correct the duty cycle of a duty-cycle-distorted clock signal using a duty cycle correction circuit. However, duty cycle correction circuits may consume substantial power and semiconductor die area. In addition, the duty cycle correction may have substantial latency (e.g., needing several clock cycles before the corrected clock signal has the desired duty cycle).

SUMMARY

In accordance with an aspect of the disclosure, a duty cycle correction circuit is provided that includes: an internal node; an inverter configured to invert a voltage of the internal node to produce an output clock signal having a corrected duty cycle; a first transistor coupled in series with a second transistor between the internal node and ground, wherein a first node for a first quadrature clock signal is coupled to a gate of the first transistor and a second node for a second quadrature clock signal is coupled to a gate of the second transistor; and a third transistor coupled in series with a fourth transistor between the internal node and ground, wherein a third node for a third quadrature clock signal is coupled to a gate of the third transistor and a fourth node for a fourth quadrature clock signal is coupled to a gate of the fourth transistor.

In accordance with another aspect of the disclosure, a method of duty cycle correction is provided that includes: switching on a first transistor in a first serial pair of transistors coupled between an internal node and ground responsive to an assertion of a first quadrature clock signal to discharge the internal node to ground through the first serial pair of transistors; switching off a second transistor in the first serial pair of transistors responsive to an assertion of a second quadrature clock signal that is delayed by one-quarter of a period of the clock signal with respect to the first quadrature clock signal; switching on a third transistor in a second serial pair of transistors coupled between the internal node and ground responsive to the assertion of the second quadrature clock signal to couple the internal node to ground through the second pair of transistors; and switching off a fourth transistor in the second pair of transistors responsive to an assertion of a third quadrature clock signal that is delayed by one-half of the period of the clock signal with respect to the first quadrature clock signal.

Finally, in accordance with another aspect of the disclosure, a duty cycle correction circuit is provided that includes: a quadrature clock source configured to generate a first quadrature clock signal, a second quadrature clock signal delayed with respect to the first quadrature clock signal by one quarter of a clock period, a third quadrature clock signal delayed with respect to the first quadrature clock signal by one half of the clock period, and a fourth quadrature clock signal delayed with respect to the first quadrature clock signal by three fourths of the clock period; an internal node; a first serial pair of switches coupled between the internal node and a power supply node for a power supply voltage, the first serial pair of switches being configured to couple the internal node to the power supply node responsive to an assertion of the third quadrature clock signal and to isolate the internal node from the power supply node responsive to an assertion of the fourth quadrature clock signal; and a second serial pair of switches coupled between the internal node and the power supply node, the second pair of switches being configured to couple the internal node to the power supply node responsive to the assertion of the third quadrature clock signal and to isolate the internal node from the power supply node responsive to the assertion of the first quadrature clock signal.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

The duty cycle correction of quadrature clock signals often requires a separate duty cycle correction circuit for each quadrature phase. Alternatively, the duty cycle correction may require a separate duty cycle correction circuit for each complementary clock phase pair such as a 0° clock signal and a 180° clock signal or such as a 90° clock signal and a 270° clock signal. For example, an alternating current (AC) coupled buffer may be used as a duty cycle correction circuit. But an AC-coupled buffer typically consumes a relatively high amount of power and semiconductor die space and also may require several clock cycles until the output clock has settled to the desired duty cycle. The resulting latency may then be problematic should the clock frequency be varied. Alternative approaches for a duty cycle correction circuit include a memory element such as a set reset (SR) latch and a one-shot generator but such duty cycle correction implementations may be risky.

Figure 1:
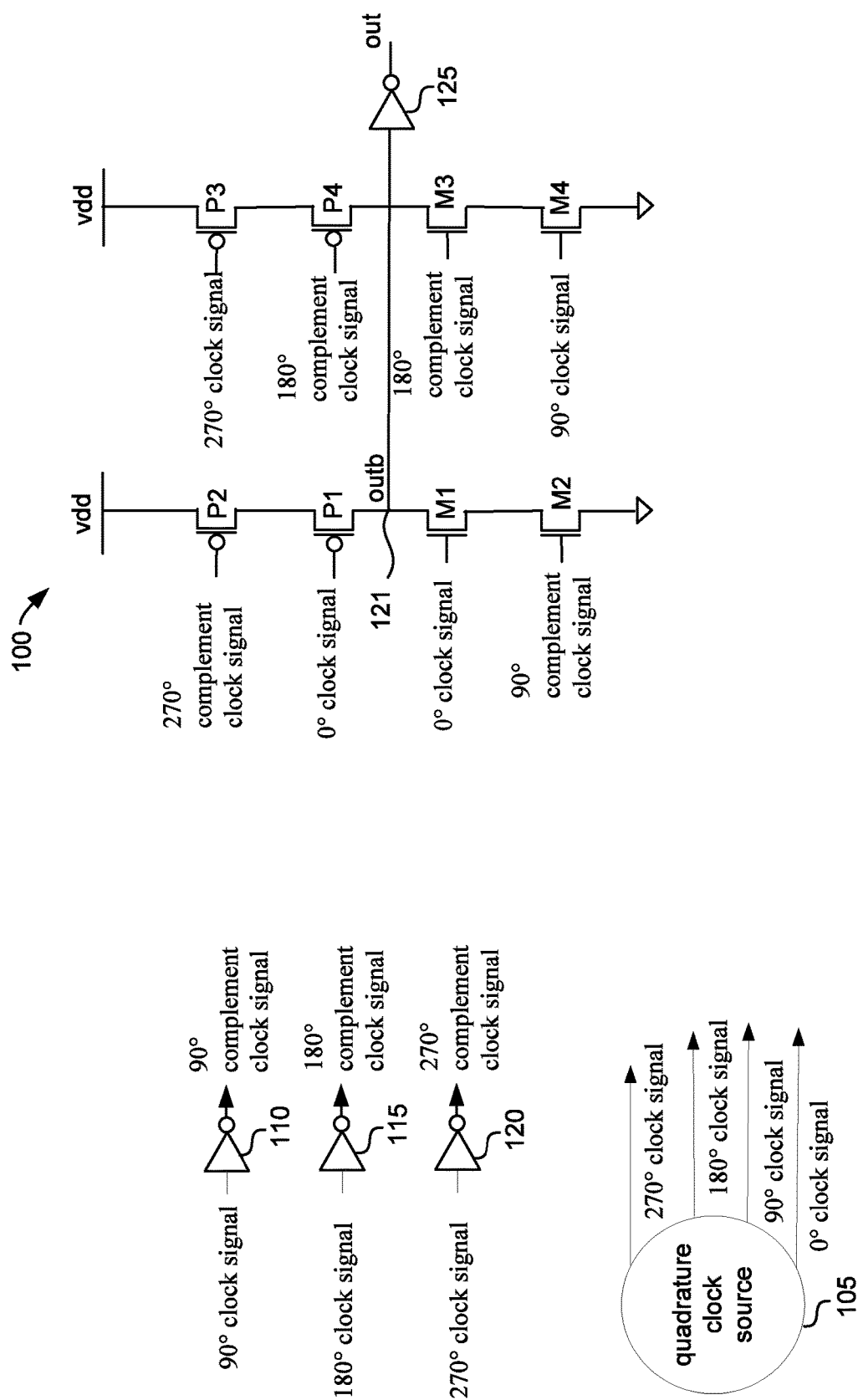
FIG. 1 illustrates a duty cycle correction circuit configured to perform duty cycle correction responsive to four quadrature clock signals from a quadrature clock source in accordance with an aspect of the disclosure.

A duty cycle correction circuit is provided that processes four quadrature clock signals to produce an output clock with a desired duty cycle such as a 50% duty cycle. The resulting duty cycle correction circuit avoids the power consumption and die demands of an AC-coupled buffer and also does not need a memory circuit nor a one-shot circuit. An example quadrature clock source 105 and a duty cycle correction circuit 100 is shown in FIG. 1. The quadrature clock source 105 generates a 0° quadrature clock signal, a 90° quadrature clock signal, a 180° quadrature clock signal, and a 270° quadrature clock signal. But these quadrature clock signals may be subjected to duty cycle distortion. To produce a clock signal having the same period but with a corrected clock signal, the duty cycle correction circuit 100 processes selected ones of the quadrature clock signals and their complements. The complements of the quadrature clock signals may be produced by corresponding inverters. For example, a first inverter 110 inverts the 90° clock signal to produce a 90° complement clock signal. Similarly, a second inverter 115 inverts the 180° clock signal to produce a 180° complement clock signal. Finally, a third inverter 120 inverts the 270° clock signal to produce a 270° complement clock signal.

To process the selected phases and their complements of the quadrature clock signals, the duty cycle correction circuit includes four n-type metal-oxide semiconductor (NMOS) transistors M1, M2, M3, and M4 as well as four p-type metal-oxide semiconductor (PMOS) transistors P1, P2, P3, and P4. The PMOS and NMOS transistors are arranged into serial pairs with respect to an internal node 121 for a complement output clock signal (outb) having a corrected duty cycle. In particular, the drains of the M1 and M2 transistors couple to the internal node 121. A drain of the M2 transistor couples to the source of the M1 transistor to whereas a source of the M2 transistor couples to ground. The M1 and M2 transistors are thus coupled in series between the internal node 121 and ground. With both of the M1 and M2 transistors switched on, the internal node 121 is coupled to ground so as to be discharged. Similarly, a drain of the M4 transistor couples to the source of the transistor M3 whereas a source of the M4 transistor couples to ground. The M3 and M4 transistors are thus coupled in series between the internal node 121 and ground such that the internal node 121 is also grounded when both the M3 and M4 transistors are switched on.

The drains of the P1 and P4 transistors are also coupled to the internal node 121. A source of the P1 transistor couples to a drain of the P2 transistor which in turn has a source coupled to a power supply node for a power supply voltage vdd. The P1 and P2 transistors are thus coupled in series between the power supply node and the internal node 121. With both of the P1 and P2 transistors switched on, the internal node 121 is thus charged to the power supply voltage. A source of the P4 transistor couples to a drain of the P3 transistor which in turn has a source coupled to the node for the power supply voltage vdd. The P3 and P4 transistors are thus coupled in series between the power supply node and the internal node 121. With both of the P3 and P4 transistors switched on, the internal node 121 will be charged to the power supply voltage. The PMOS transistors P1, P2, P3, and P4 may thus also be denoted as pull-up transistors since they function to charge (or pull up in voltage) the internal node 121. With regard to this pull-up function, it will be appreciated that the order of the pull-up transistors in each serial pair may be reversed with respect to what is shown in FIG. 1 in alternative implementations. For example, the source of transistor P1 could instead be coupled to the power supply node whereas the drain of transistor P2 could instead be coupled to the internal node 121. Similarly, the source of transistor P4 could instead be coupled to the power supply node whereas the drain of transistor P3 could instead be coupled to the internal node 121.

The NMOS transistors M1, M2, M3, and M4 may also be denoted as pull-down transistors since they function to discharge (or pull down in voltage) the internal node 121. Transistors M1 and M2 form a first serial pair of pull-down transistors. Similarly, transistors M3 and M4 form a second serial pair of pull-down transistors. Analogously as discussed with respect to the serial pairs of pull-up transistors, the order of the pull-down transistors in each serial pair of pull-down transistors may be reversed with respect to what is shown in FIG. 1 in alternative implementations. For example, the source of transistor M1 could instead be coupled to ground whereas the drain of transistor M2 could instead be coupled to the internal node 121. Similarly, the source of transistor M3 could instead be coupled to ground whereas the drain of transistor M4 could instead be coupled to the internal node 121.

An inverter 125 inverts the complement output clock signal outb carried on the internal node 121 to produce an output clock signal (out) having the corrected 50% duty cycle. To provide this 50% duty cycle correction despite the uncorrected duty cycle of the quadrature clock signals, the 0° quadrature clock signal drives the gates of the P1 and the M1 transistors. Thus, a node for the 0° quadrature clock signal couples to the gates of the P1 and M1 transistors. Similarly, a node for the 180° complement quadrature clock signal couples to the gates of the P4 and M3 transistors. A node for the 90° complement quadrature clock signal couples to the gate of the M2 transistor whereas a node for the 90° quadrature clock signal couples to the gate of the M4 transistor. Finally, a node for the 270° complement quadrature clock signal couples to the gate of the P2 transistor whereas a node for the 270° quadrature clock signal couples to the gate of the P3 transistor.

Figure 2:
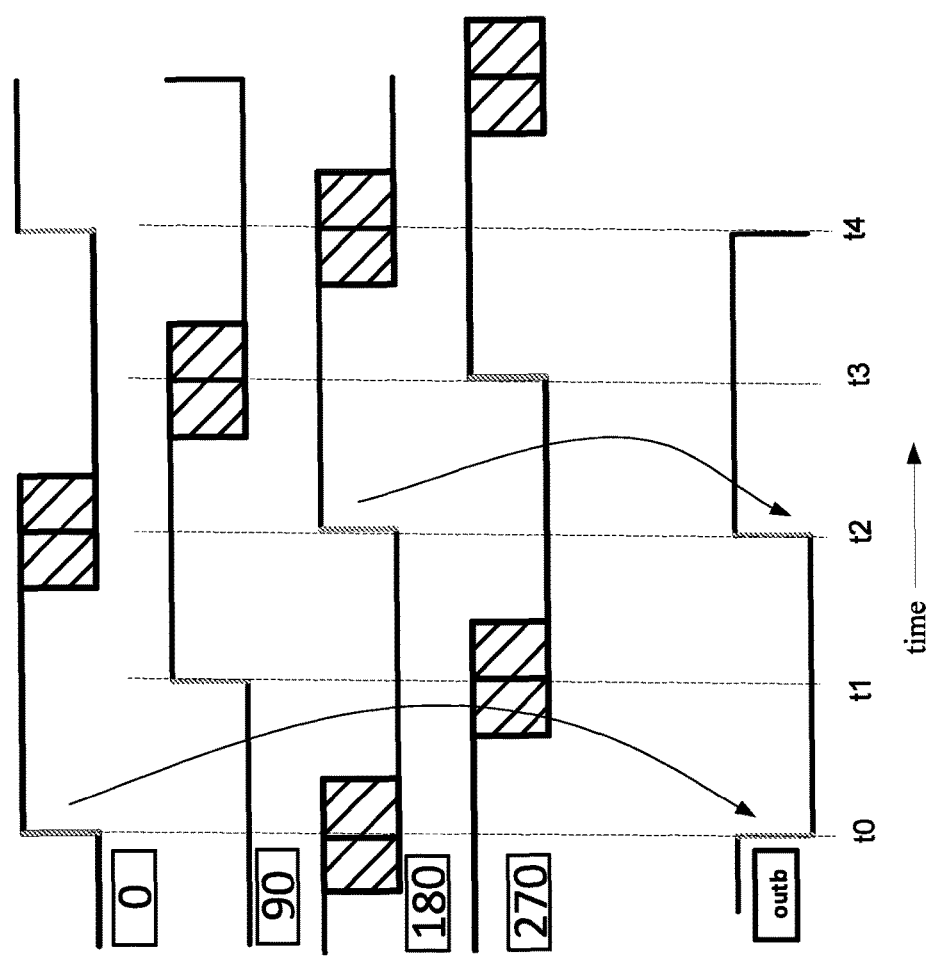
FIG. 2 is a timing diagram for the four quadrature clock signals and a complement output clock signal having a corrected duty cycle in accordance with an aspect of the disclosure.

The resulting duty cycle correction provided by duty cycle correction circuit 100 may be better appreciated through a consideration of a timing diagram of the quadrature clock signals and the complement output clock signal outb shown in FIG. 2. Note that the rising edges of the quadrature clock signals have the desired quadrature relationship. For example, a rising edge of the 0° quadrature clock signal occurs at a time t0. After a complete period of the clock, the 0° quadrature clock signal has a subsequent rising edge at a time t4. Given this clock period extending from t0 to t4, the 90° quadrature clock signal has a rising edge at a time t1 that occurs at one-fourth of the clock period after time t0. Similarly, the 180° quadrature clock signal has a rising edge at time t2 that occurs one-half of the clock period after time t0. Finally, the 270° quadrature clock signal has a rising edge at a time t3 that occurs three-fourths of the clock period after time t0.

If the quadrature clock signals had a 50% duty cycle, the 0° quadrature clock signal would have a falling edge (transition from the power supply voltage to ground) at time t2. But the presence of duty cycle distortion causes the falling edge to fall in some range about time t2 depending upon whether the duty cycle distortion is less than 50% or greater than 50%. Similarly, the 90° quadrature clock signal should have a falling edge at time t3 if the 90° quadrature clock signal had a 50% duty cycle but instead the falling edge falls into some range about time t3 due to the duty cycle distortion. The falling edges of the 180° and the 270° quadrature clock signals have similar duty cycle distortion.

Referring again to FIG. 1, note that the M1 transistor will switch on at time t0 since the 0° clock signal has a rising edge at this time (transitions from ground to the power supply voltage). Since the 90° quadrature clock signal had a falling edge prior to time t0, the 90° complement quadrature clock signal (not illustrated in FIG. 2) already had a rising edge prior to time t0 so that M2 transistor was already conducting prior to the switching on of the M1 transistor. The internal node 121 is thus discharged at time t0, which causes the complement output clock signal outb to have a falling edge at time t0. In turn, this causes the output clock signal out to have a rising edge at time t0 (assuming that the processing delay through the inverter 125 is relatively small). The 90° quadrature clock signal has a rising edge at time t1, which means that the 90° complement clock signal has a falling edge at time t1 that switches off transistor M2. The serial pair of transistors formed by the M1 and M2 transistors thus functions to ground the internal node 121 for one quarter of the clock period (from time t0 to time t1).

Each of the serial pair of transistors has a similar one-quarter clock period in which the serial pair of transistors is conducting. For example, the M4 transistor in the serial pair formed by the M4 and M3 transistors begins conducting at time t1 due to the rising edge of the 90° quadrature clock signal. Prior to time t1, the 180° quadrature clock signal is low, which means that the 180° complement clock signal (not illustrated in FIG. 2) is high. Thus, the serial pair formed by the M4 and M3 transistors is conducting at time t1 to continue the coupling of the internal node 121 to ground. At time t2, the 180° quadrature clock signal has a rising edge, which means the 180° complement quadrature clock signal has a falling edge so as to switch off the M3 transistor. The serial pair of transistors formed by the M3 and M4 transistors thus functions to ground the internal node 121 for one quarter of the clock period (from time t1 to time t2). From the combined action of the serial pair of transistors M1 and M2 as well as the serial pair of transistors M3 and M4, it may thus be seen that the complement output clock signal outb has the desired 50% duty cycle for being discharged, which in turn causes the output clock signal out to be asserted from time t0 to time t2 so as to also have a 50% duty cycle.

The serial pair of transistors P3 and P4 function to charge the internal node 121 from time t2 to time t3. At time t2, the 180° quadrature clock signal has a rising edge, which means that the 180° complement quadrature clock signal will have a falling edge (transition from being charged to the power supply voltage to ground). Thus, the P4 transistor will switch on at time t2. The 270° clock signal was already discharged prior to time t2 so that the P3 transistor is already conducting at the switching on of the P4 transistor at time t2. It may thus be seen that the serial pair of transistors P3 and P4 conducts beginning at time t2 to charge the internal node 121 to the power supply voltage. The 270° clock signal has a rising edge at time t3, which switches off transistor P3. The serial pair of transistors P3 and P4 thus functions to charge the internal node 121 from time t2 to time t3 (one-quarter of the clock period).

The serial pair of transistors P1 and P2 function to charge the internal node from time t3 to time t4, which is again one-quarter of the clock period. In particular, the 270° quadrature clock signal has a rising edge at time t3, which means the 270° complement quadrature clock signal has a falling edge at time t3. This switches on the P2 transistor. The P1 transistor was already conducting at time t3 since it is controlled by the 0° quadrature clock signal. The serial pair of transistors P1 and P2 thus couples the power supply node to the internal node 121 beginning at time t3 to maintain the charging of the internal node 121 to the power supply voltage. At time t4, the 0° quadrature clock signal has a rising edge, which shuts off the P1 transistor. The serial pair formed by the P1 and P2 transistors thus ensures that the complement output clock signal outb remains charged from time t3 to time t4 so that the desired 50% duty cycle is achieved.

More generally, the quadrature clock source 105 is an example of a quadrature clock source configured to generate a first quadrature clock signal, a second quadrature clock signal, a third quadrature clock signal, and a fourth quadrature clock signal. An example of the first quadrature clock signal is the 0° quadrature clock signal. Each successive quadrature clock signal is delayed by one quarter of the clock period. In such an example, the second quadrature clock signal is the 90° quadrature clock signal since it is delayed by one-quarter of the clock period with respect to the 0° quadrature clock signal. Similarly, an example of the third quadrature clock signal is the 180° quadrature clock signal since it is delayed by one-quarter of the clock period with respect to the 90° quadrature clock signal. Similarly, the 270° quadrature clock signal is delayed by one-quarter of the clock period with respect to the 180° quadrature clock signal such that the 270° quadrature clock signal is an example of the fourth quadrature clock signal.

Note that in such a quadrature succession it is arbitrary as to what quadrature clock signal is designated as the first quadrature clock signal. For example, if the 270° quadrature clock signal were designated as the first quadrature clock signal, then the 0° quadrature clock signal would be an example of the second quadrature clock signal and so on. Given this quadrature succession of the quadrature clock signals, the four serial pairs of transistors may be deemed to form four corresponding pairs of serial switches. For example, the serial pair of the P3 and P4 transistors is an example of a first serial pair of switches coupled between the internal node 121 and the power supply node, the first serial pair of switches being configured to couple the internal node 121 to the power supply node responsive to an assertion of the third quadrature clock signal and to isolate the internal node from the power supply node responsive to an assertion of the fourth quadrature clock signal. Similarly, the serial pair of P1 and P2 transistors is an example of a second serial pair of switches coupled between the internal node 121 and the power supply node, the second serial pair of switches being configured to couple the internal node 121 to the power supply node responsive to the assertion of the fourth quadrature clock signal and to isolate the internal node 121 from the power supply node responsive to the assertion of the first quadrature clock signal. In addition, the serial pair of the M1 and M2 transistors are an example of a third serial pair of switches coupled between the internal node 121 and ground, the third serial pair of switches being configured to couple the internal node 121 to ground responsive to the assertion of the first quadrature clock signal and to isolate the internal node from ground responsive to an assertion of the second quadrature clock signal. Finally, the serial pair of the M3 and M4 transistors are an example of a fourth serial pair of switches coupled between the internal node and ground, the fourth serial pair of switches being configured to couple the internal node to ground responsive to the assertion of the second quadrature clock signal and to isolate the internal node from ground responsive to an assertion of the third quadrature clock signal.

The resulting operation of the duty cycle correction circuit 100 is quite advantageous. For example, a 50% duty cycle correction is achieved through the quadrature clock control of just eight transistors so that the duty cycle correction circuit 100 is relatively compact and thus demands relatively little semiconductor die space. In addition, the M1, M2, M3, and M4 transistors conduct current only during the initial discharging of the internal node 121 (ignoring any leakage current while these transistors are off and the internal node 121 is charged). Similarly, the P1, P2, P3, and P4 transistors conduct current only during the initial charging of the internal node 121 (ignoring any leakage current while these transistors are off and the internal node 121 is grounded).

Figure 3:
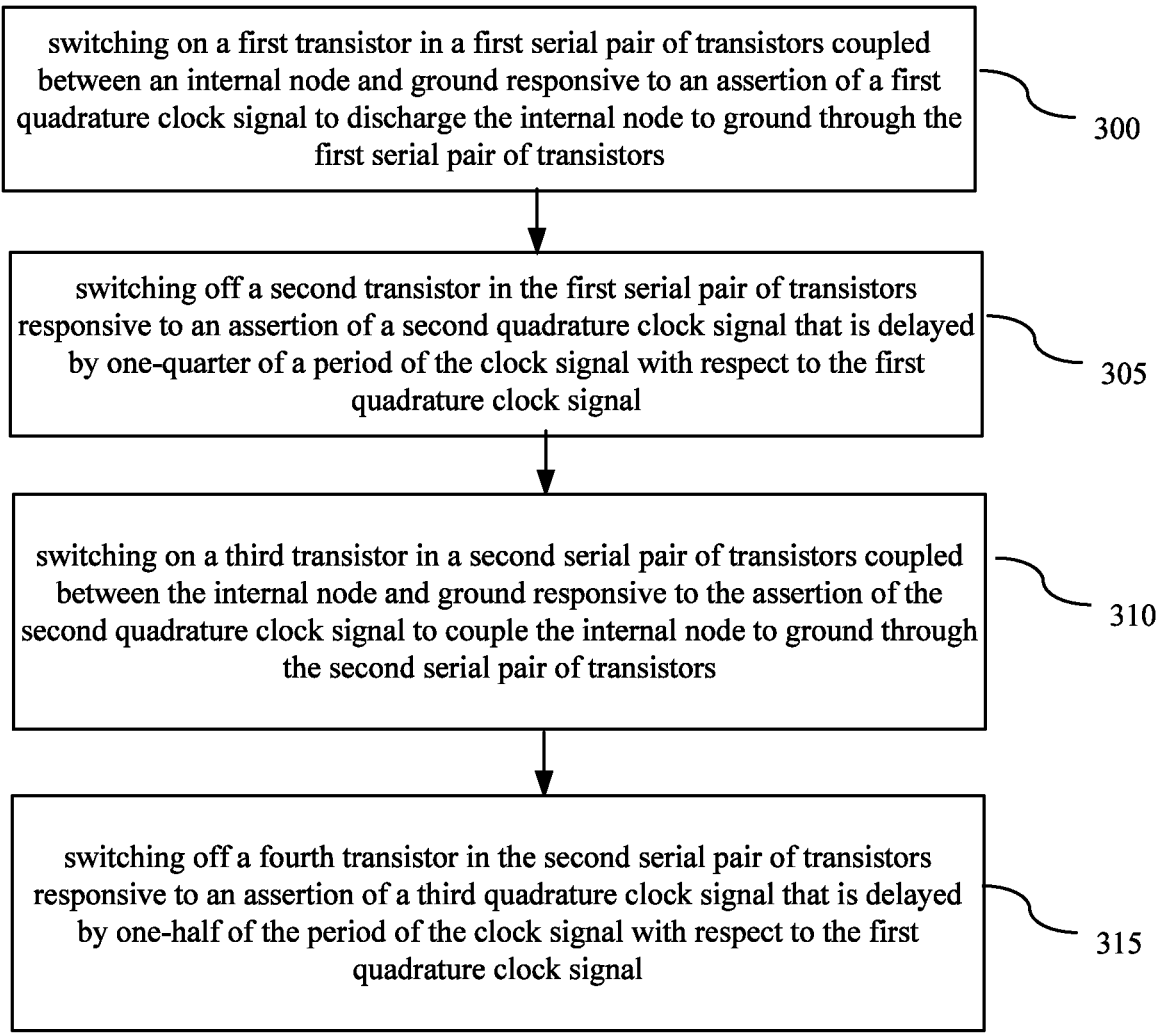
FIG. 3 is a flowchart for a duty cycle correction method in accordance with an aspect of the disclosure.

A method of correcting the duty cycle of a clock signal will now be described with respect to the flowchart of FIG. 3. The method includes an act 300 of switching on a first transistor in a first serial pair of transistors coupled between an internal node and ground responsive to an assertion of a first quadrature clock signal to discharge the internal node to ground through the first serial pair of transistors. The switching on of the transistor M1 in the serial pair of transistors M1 and M2 responsive to the assertion of the 0° quadrature clock signal is an example of act 300. The method also includes an act 305 of switching off a second transistor in the first serial pair of transistors responsive to an assertion of a second quadrature clock signal that is delayed by one-quarter of a period of the clock signal with respect to the first quadrature clock signal. The switching off of the transistor M2 responsive to the assertion of the 90° quadrature clock signal is an example of act 305. In addition, the method includes an act 310 of switching on a third transistor in a second serial pair of transistors coupled between the internal node and ground responsive to the assertion of the second quadrature clock signal to couple the internal node to ground through the second serial pair of transistors. The switching on of the M4 transistor in the serial pair of transistors M3 and M4 responsive to the assertion of the 90° quadrature clock signal is an example of act 310. Finally, the method includes an act 315 of switching off a fourth transistor in the second serial pair of transistors responsive to an assertion of a third quadrature clock signal that is delayed by one-half of the period of the clock signal with respect to the first quadrature clock signal. The switching off of the M3 transistor responsive to the assertion of the 180° quadrature clock signal is an example of act 315.

Figure 4:
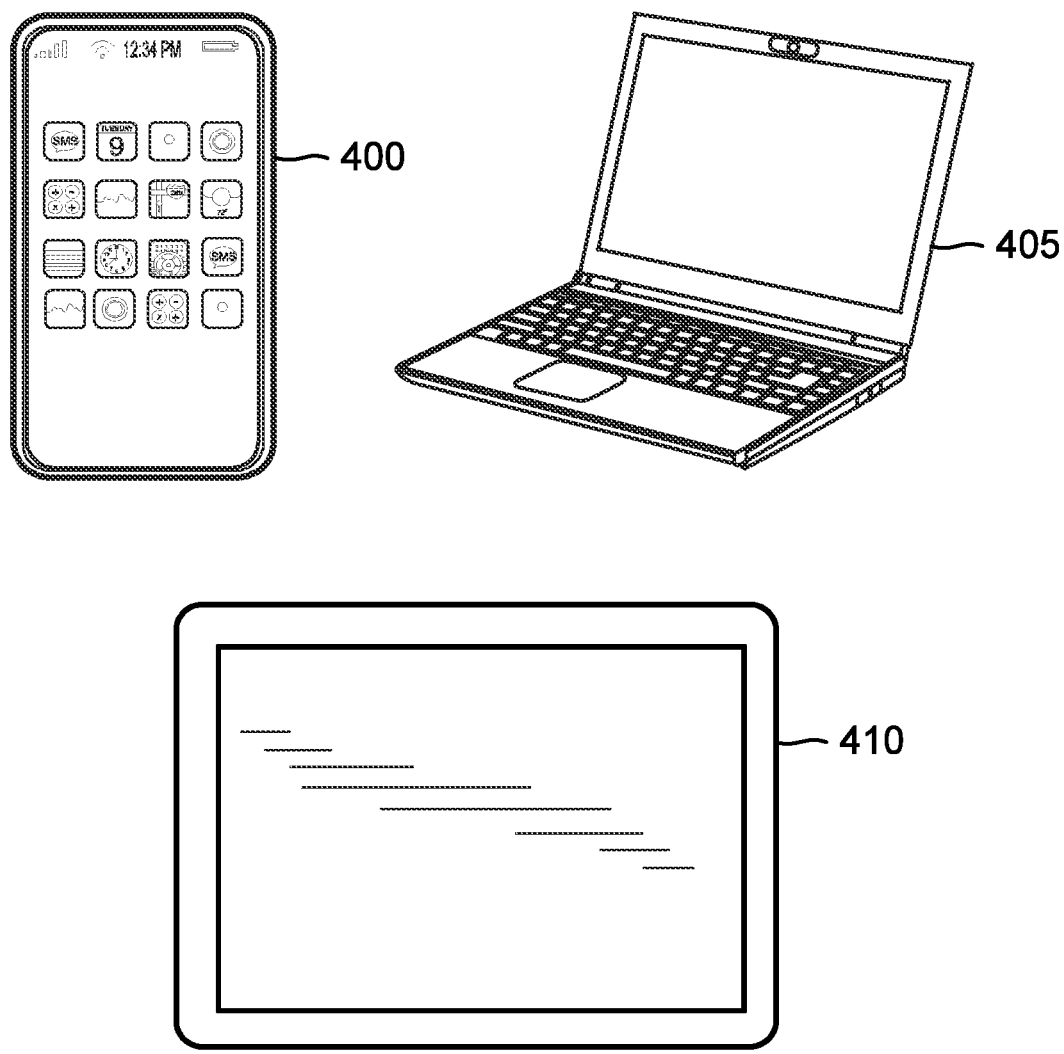
FIG. 4 illustrates some example electronic systems including an integrated circuit having a duty cycle correction circuit in accordance with an aspect of the disclosure.

An integrated circuit having a duty cycle correction circuit as disclosed herein may be advantageously employed in a wide variety of electronic systems. For example, as shown in FIG. 4, a cellular telephone 400, a laptop computer 405, and a tablet PC 410 may all include an integrated circuit having a duty cycle correction circuit in accordance with the disclosure. Other exemplary electronic systems such as a music player, a video player, a communication device, and a personal computer may also be configured with an integrated circuit having a duty cycle correction circuit constructed in accordance with the disclosure.

The disclosure will now be summarized through the following clauses:

Clause 1. A duty cycle correction circuit comprising:
an internal node;
an inverter configured to invert a voltage of the internal node to produce an output clock signal having a corrected duty cycle;
a first transistor coupled in series with a second transistor between the internal node and ground, wherein a first node for a first quadrature clock signal is coupled to a gate of the first transistor and a second node for a second quadrature clock signal is coupled to a gate of the second transistor; and
a third transistor coupled in series with a fourth transistor between the internal node and ground, wherein a third node for a third quadrature clock signal is coupled to a gate of the third transistor and a fourth node for a fourth quadrature clock signal is coupled to a gate of the fourth transistor.

Clause 2. The duty cycle correction circuit of clause 1, wherein the first quadrature clock signal is a 0° quadrature clock signal.

Clause 3. The duty cycle correction circuit of clause 2, wherein the second quadrature clock signal is a complement of a 90° quadrature clock signal that is delayed by one quarter of a period of the output clock signal with respect to the 0° quadrature clock signal.

Clause 4. The duty cycle correction circuit of clause 3, wherein the third quadrature clock signal is the 90° quadrature clock signal.

Clause 5. The duty cycle correction circuit of clause 4, wherein the fourth quadrature clock signal is a complement of a 180° quadrature clock signal that is delayed by one half of the period of the output clock signal with respect to the 0° quadrature clock signal.

Clause 6. The duty cycle correction circuit of any of clauses 1-5, wherein the first transistor, the second transistor, the third transistor, and the fourth transistor each comprises an n-type metal-oxide semiconductor (NMOS) transistor.

Clause 7. The duty cycle correction circuit of clause 6, wherein a drain of the first transistor and a drain of the fourth transistor are both coupled to the internal node, a drain of the second transistor is coupled to a source of the first transistor, a source of the second transistor is coupled to ground, a drain of the third transistor is coupled to a source of the fourth transistor, and a source of the third transistor is coupled to ground.

Clause 8. The duty cycle correction circuit of clause 5, further comprising:
a quadrature clock source configured to provide the 0° quadrature clock signal, the 90° quadrature clock signal, and the 180° quadrature clock signal;
a first inverter configured to invert the 90° quadrature clock signal to provide the complement of the 90° quadrature clock signal; and
a second inverter configured to invert the 180° quadrature clock signal to provide the complement of the 180° quadrature clock signal.

Clause 9. The duty cycle correction circuit of clause 5, further comprising:
a fifth transistor coupled in series with a sixth transistor between the internal node and a power supply node for a power supply voltage, wherein the fourth node is coupled to a gate of the fifth transistor and a fifth node for a 270° quadrature clock signal that is delayed by three fourth of the period of the output clock signal with respect to the 0° quadrature clock signal is coupled to a gate of the sixth transistor; and
a seventh transistor coupled in series with an eighth transistor between the internal node and the power supply node, wherein a first node is coupled to a gate of the seventh transistor and a sixth node for a complement of the 270° quadrature clock signal is coupled to a gate of the eighth transistor.

Clause 10. The duty cycle correction circuit of clause 9, wherein the fifth transistor, the sixth transistor, the seventh transistor, and the eighth transistor each comprises a p-type metal-oxide semiconductor (PMOS) transistor.

Clause 11. The duty cycle correction circuit of clause 10, wherein a drain of the fifth transistor and a drain of the seventh transistor are both coupled to the internal node, a source of the fifth transistor is coupled to a drain of the sixth transistor, a source of the seventh transistor is coupled to a drain of the eighth transistor, and a source of the fifth transistor and a source of the eighth transistor are both coupled to the power supply node.

Clause 12. The duty cycle correction circuit of any of clauses 1-11, wherein the duty cycle correction circuit is integrated into a cellular telephone.

Clause 13. A method of correcting a duty cycle of a clock signal, comprising:
  switching on a first transistor in a first serial pair of transistors coupled between an internal node and ground responsive to an assertion of a first quadrature clock signal to discharge the internal node to ground through the first serial pair of transistors;
  switching off a second transistor in the first serial pair of transistors responsive to an assertion of a second quadrature clock signal that is delayed by one-quarter of a period of the clock signal with respect to the first quadrature clock signal;
  switching on a third transistor in a second serial pair of transistors coupled between the internal node and ground responsive to the assertion of the second quadrature clock signal to couple the internal node to ground through the second pair of transistors; and
  switching off a fourth transistor in the second pair of transistors responsive to an assertion of a third quadrature clock signal that is delayed by one-half of the period of the clock signal with respect to the first quadrature clock signal.

Clause 14. The method of clause 13, further comprising:
  inverting a voltage of the internal node to produce an output clock signal having a corrected duty cycle.

Clause 15. The method of clause 14, wherein the corrected duty cycle is a 50% duty cycle.

Clause 16. The method of clause 14, further comprising:
  switching on a fifth transistor in a third serial pair of transistors coupled between the internal node and a power supply node for a power supply voltage responsive to an assertion of the first quadrature clock signal to couple the internal node to the power supply node through the third serial pair of transistors;
  switching off a sixth transistor in the third serial pair of transistors responsive to an assertion of a fourth quadrature clock signal that is delayed by three fourth of the period of the clock signal with respect to the first quadrature clock signal;
  switching on a seventh transistor in a fourth serial pair of transistors coupled between the internal node and the power supply voltage responsive to the assertion of the fourth quadrature clock signal to couple the internal node to the power supply node through the fourth serial pair of transistors; and
  switching off an eighth transistor in the fourth serial pair of transistors responsive to an assertion of the first quadrature clock signal.

Clause 17. A duty cycle correction circuit comprising:
  a quadrature clock source configured to generate a first quadrature clock signal, a second quadrature clock signal delayed with respect to the first quadrature clock signal by one quarter of a clock period, a third quadrature clock signal delayed with respect to the first quadrature clock signal by one half of the clock period, and a fourth quadrature clock signal delayed with respect to the first quadrature clock signal by three fourths of the clock period;
  an internal node;
  a first serial pair of switches coupled between the internal node and a power supply node for a power supply voltage, the first serial pair of switches being configured to couple the internal node to the power supply node responsive to an assertion of the third quadrature clock signal and to isolate the internal node from the power supply node responsive to an assertion of the fourth quadrature clock signal; and
  a second serial pair of switches coupled between the internal node and the power supply node, the second pair of switches being configured to couple the internal node to the power supply node responsive to the assertion of the third quadrature clock signal and to isolate the internal node from the power supply node responsive to the assertion of the first quadrature clock signal.

Clause 18. The duty cycle correction circuit of clause 17, further comprising:
  an inverter configured to invert a voltage of the internal node to produce an output clock signal with a corrected duty cycle.

Clause 19. The duty cycle correction circuit of clause 18, wherein the corrected duty cycle is a 50% duty cycle.

Clause 20. The duty cycle correction circuit of any of clauses 17-19, further comprising:
  a third serial pair of switches coupled between the internal node and ground, the third serial pair of switches being configured to couple the internal node to ground responsive to the assertion of the first quadrature clock signal and to isolate the internal node from ground responsive to an assertion of the second quadrature clock signal; and
  a fourth serial pair of switches coupled between the internal node and ground, the fourth serial pair of switches being configured to couple the internal node to ground responsive to the assertion of the second quadrature clock signal and to isolate the internal node from ground responsive to an assertion of the third quadrature clock signal.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A duty cycle correction circuit comprising:
  an internal node;
  an inverter configured to invert a voltage of the internal node to produce an output clock signal having a corrected duty cycle;
  a first transistor coupled in series with a second transistor between the internal node and ground, wherein a first node for a first quadrature clock signal is coupled to a gate of the first transistor and a second node for a second quadrature clock signal is coupled to a gate of the second transistor, wherein the first quadrature clock signal is a 0° quadrature clock signal and the second quadrature clock signal is a complement of a 90° quadrature clock signal that is delayed by one-quarter of a period of the output clock signal with respect to the 0° quadrature clock signal; and a third transistor coupled in series with a fourth transistor between the internal node and ground, wherein a third node for a third quadrature clock signal is coupled to a gate of the third transistor and a fourth node for a fourth quadrature clock signal is coupled to a gate of the fourth transistor.

2. The duty cycle correction circuit of claim 1, wherein the third quadrature clock signal is the 90° quadrature clock signal.

3. The duty cycle correction circuit of claim 2, wherein the fourth quadrature clock signal is a complement of a 180° quadrature clock signal that is delayed by one-half of the period of the output clock signal with respect to the 0° quadrature clock signal.

4. The duty cycle correction circuit of claim 3, further comprising:
a quadrature clock source configured to provide the 0° quadrature clock signal, the 90° quadrature clock signal, and the 180° quadrature clock signal;
a first inverter configured to invert the 90° quadrature clock signal to provide the complement of the 90° quadrature clock signal; and
a second inverter configured to invert the 180° quadrature clock signal to provide the complement of the 180° quadrature clock signal.

5. The duty cycle correction circuit of claim 3, further comprising:
a fifth transistor coupled in series with a sixth transistor between the internal node and a power supply node for a power supply voltage, wherein the fourth node is coupled to a gate of the fifth transistor and a fifth node for a 270° quadrature clock signal that is delayed by three-fourths of the period of the output clock signal with respect to the 0° quadrature clock signal is coupled to a gate of the sixth transistor; and
a seventh transistor coupled in series with an eighth transistor between the internal node and the power supply node, wherein the first node is coupled to a gate of the seventh transistor and a sixth node for a complement of the 270° quadrature clock signal is coupled to a gate of the eighth transistor.

6. The duty cycle correction circuit of claim 5, wherein the fifth transistor, the sixth transistor, the seventh transistor, and the eighth transistor each comprises a p-type metal-oxide semiconductor (PMOS) transistor.

7. The duty cycle correction circuit of claim 6, wherein a drain of the fifth transistor and a drain of the seventh transistor are both coupled to the internal node, a source of the fifth transistor is coupled to a drain of the sixth transistor, a source of the seventh transistor is coupled to a drain of the eighth transistor, and a source of the fifth transistor and a source of the eighth transistor are both coupled to the power supply node.

8. The duty cycle correction circuit of claim 1, wherein the first transistor, the second transistor, the third transistor, and the fourth transistor each comprises an n-type metal-oxide semiconductor (NMOS) transistor.

9. The duty cycle correction circuit of claim 8, wherein a drain of the first transistor and a drain of the fourth transistor are both coupled to the internal node, a drain of the second transistor is coupled to a source of the first transistor, a source of the second transistor is coupled to ground, a drain of the third transistor is coupled to a source of the fourth transistor, and a source of the third transistor is coupled to ground.

10. The duty cycle correction circuit of claim 1, wherein the duty cycle correction circuit is integrated into a cellular telephone.

11. A method of correcting a duty cycle of a clock signal, comprising:
generating a first quadrature clock signal, a second quadrature clock signal that is delayed by one-quarter of a period of the clock signal with respect to the first quadrature clock signal, and a third quadrature clock signal that is delayed by one-quarter of the period of the clock signal with respect to the second quadrature clock signal;
inverting the second quadrature clock signal to provide a first complement quadrature clock signal;
inverting the third quadrature clock signal to provide a second complement quadrature clock signal;
switching on a first transistor in a first serial pair of transistors coupled between an internal node and ground responsive to an assertion of the first complement quadrature clock signal and switching on a second transistor in the first serial pair of transistors responsive to an assertion of the first quadrature clock signal to discharge the internal node to ground through the first serial pair of transistors;
switching off the first transistor responsive to a de-assertion of the first complement quadrature clock signal;
switching on a third transistor in a second serial pair of transistors coupled between the internal node and ground responsive to an assertion of the second complement quadrature clock signal and switching on a fourth transistor in the second serial pair of transistors responsive to an assertion of the second quadrature clock signal to couple the internal node to ground through the second serial pair of transistors; and
switching off the third transistor responsive to a de-assertion of the second complement clock signal.

12. The method of claim 11, further comprising:
inverting a voltage of the internal node to produce an output clock signal having a corrected duty cycle.

13. The method of claim 12, wherein the corrected duty cycle is a 50% duty cycle.

14. The method of claim 12, further comprising:
generating a fourth quadrature clock signal that is delayed by one-quarter of the period of the clock signal with respect to the third quadrature clock signal;
inverting the fourth quadrature clock signal to provide a third complement clock signal;
switching on a fifth transistor in a third serial pair of transistors coupled between the internal node and a power supply node for a power supply voltage responsive to a de-assertion of the first quadrature clock signal to couple the internal node to the power supply node through the third serial pair of transistors;
switching off a sixth transistor in the third serial pair of transistors responsive to a de-assertion of the third complement quadrature clock signal;
switching on a seventh transistor in a fourth serial pair of transistors coupled between the internal node and the power supply voltage responsive to a de-assertion of the fourth quadrature clock signal to couple the internal node to the power supply node through the fourth serial pair of transistors; and switching off an eighth transistor in the fourth serial pair of transistors responsive to a de-assertion of the second complement quadrature clock signal.

15. A duty cycle correction circuit comprising:
a quadrature clock source configured to generate a first quadrature clock signal, a second quadrature clock signal delayed with respect to the first quadrature clock signal by one quarter of a clock period, a third quadrature clock signal delayed with respect to the first quadrature clock signal by one half of the clock period, and a fourth quadrature clock signal delayed with respect to the first quadrature clock signal by three fourths of the clock period;
an internal node;
a first PMOS transistor and a second PMOS transistor coupled in series between the internal node and a power supply node for a power supply voltage, wherein a gate of the first PMOS transistor is coupled to the first quadrature clock signal and a gate of the second PMOS transistor is coupled to a complement of the fourth quadrature clock signal; and
a third PMOS transistor and a fourth PMOS transistor coupled in series between the internal node and the power supply node, wherein a gate of the third PMOS transistor is coupled to the fourth quadrature clock signal and a gate of the fourth PMOS transistor is coupled to a complement of the third quadrature clock signal.

16. The duty cycle correction circuit of claim 15, further comprising:
an inverter configured to invert a voltage of the internal node to produce an output clock signal with a corrected duty cycle.

17. The duty cycle correction circuit of claim 16, wherein the corrected duty cycle is a 50% duty cycle.

18. The duty cycle correction circuit of claim 15, further comprising:
a a first NMOS transistor and a second NMOS transistor coupled between the internal node and ground, wherein a gate of the first NMOS transistor is coupled to the first quadrature clock signal and a gate of the second NMOS transistor is coupled to a complement of the second quadrature clock signal; and
a a third NMOS transistor and a fourth NMOS transistor coupled between the internal node and ground, wherein a gate of the third NMOS transistor is coupled to the complement of the third quadrature clock signal and a gate of the fourth NMOS transistor is coupled to the second quadrature clock signal.

* * * * *